United States Patent

Baumgärtl et al.

Patent Number: 5,859,529
Date of Patent: Jan. 12, 1999

[54] VOLTAGE TRANSFORMER WITH INCREASED ELECTRIC STRENGTH

[75] Inventors: Ulrich Baumgärtl; Wolfgang Röhl, both of Berlin, Germany

[73] Assignee: Siemens Aktiengesellschaft, Münchnen, Germany

[21] Appl. No.: 894,575

[22] PCT Filed: Feb. 16, 1996

[86] PCT No.: PCT/DE96/00291

§ 371 Date: Dec. 18, 1997

§ 102(e) Date: Dec. 18, 1997

[87] PCT Pub. No.: WO96/26447

PCT Pub. Date: Aug. 29, 1996

[30] Foreign Application Priority Data

Feb. 24, 1995 [DE] Germany ............... 19507934.5

[51] Int. Cl.[6] .................................................. H01F 30/12
[52] U.S. Cl. .................................................... 323/361
[58] Field of Search .......................... 363/15, 16, 95, 363/131; 323/355, 361

[56] References Cited

U.S. PATENT DOCUMENTS

| | | | |
|---|---|---|---|
| 3,840,720 | 10/1974 | Wolf | 323/361 |
| 4,980,811 | 12/1990 | Suzuji et al. | 363/21 |
| 5,663,636 | 9/1997 | Falldin et al. | 323/361 |
| 5,729,121 | 3/1998 | Coenders et al. | 323/361 |

*Primary Examiner*—Matthew V. Nguyen
*Attorney, Agent, or Firm*—Kenyon & Kenyon

[57] ABSTRACT

A voltage transformer with increased electric strength has a resistance divider made of ohmic resistances as well as a working amplifier and an inductive transformer. The secondary side of the inductive transformer forms the undervoltage side of the voltage transformer. Since high electric strength resistances are cheap to obtain, this voltage transformer is particularly useful in cases where an inductive voltage cannot be used because of its size and price, for example in low voltage power switches with voltage display or voltage measurement.

1 Claim, 1 Drawing Sheet

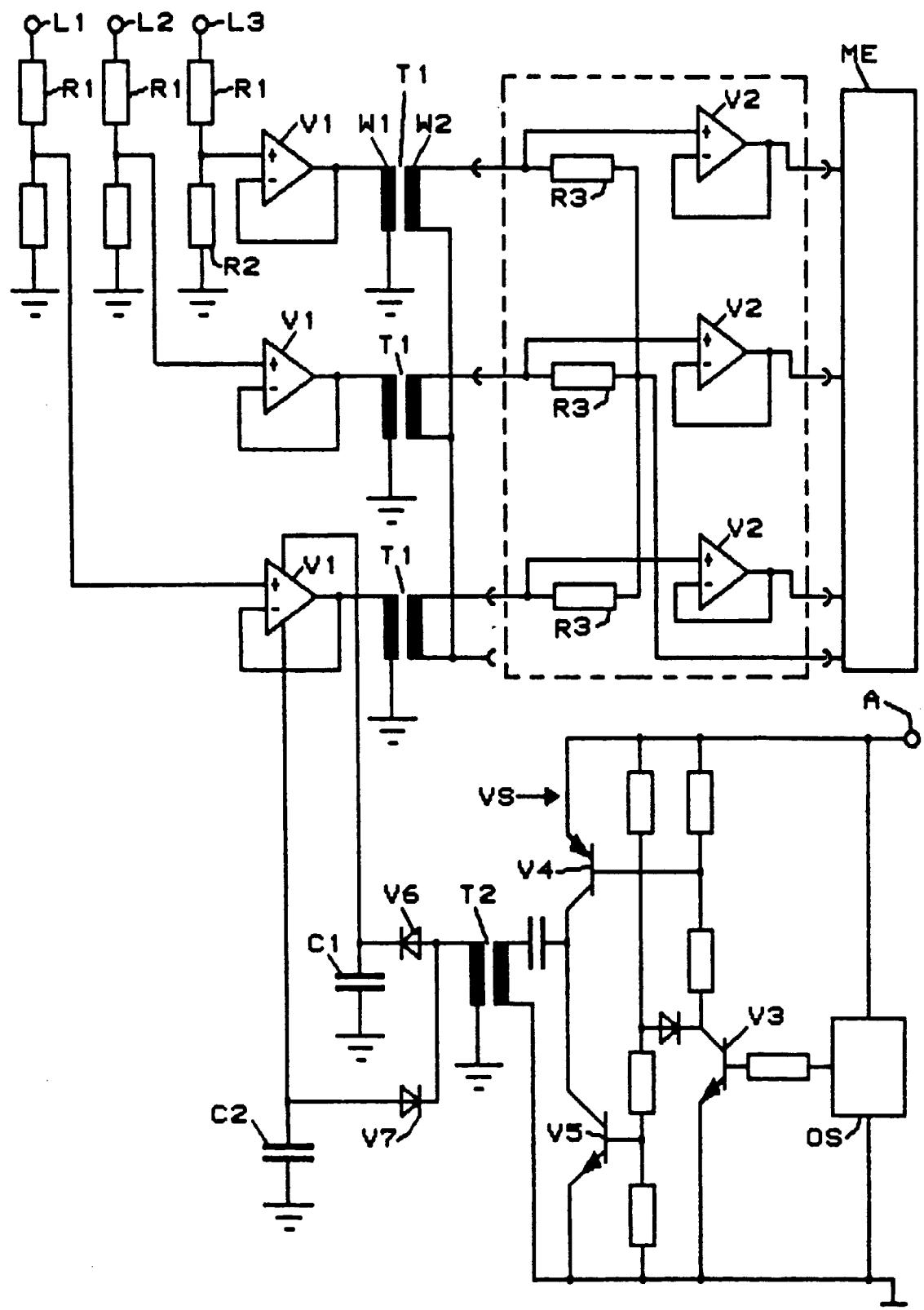

VOLTAGE TRANSFORMER WITH INCREASED ELECTRIC STRENGTH

The invention relates to a voltage transformer having increased dielectric strength for use in a low-voltage power switch.

Current transformers that provide the input signals for an overcurrent trip are standard low-voltage power switch equipment. They may, however, have the additional task of measuring the voltage at the location of the power switch, for example for performing a power measurement, or having the capability to display the line voltage.

In general, this task can be performed with the aid of known inductive voltage transformers. The requirement exists, however, that, given the stipulated high-voltage check of a low-voltage power switch with, for example, 3.5 kV, voltage transformers must also be included if the transformers are connected in operation. Inductive voltage transformers dimensioned for this type of high testing voltage, however, represent a costly special design that does not possess the desired small size and low price.

Typical transformers, as used, for example, for supplying current to undervoltage trips (German book 'Niederspannungs-Leistungsschalter', Springer, 1970, pp. 135 to 137) are unsuitable for the present application because of their properties and their size.

A capacitive voltage transformer for a metal-clad high-voltage system is already known; this transformer comprises a capacitive divider and an amplifier circuit having operational amplifiers. This measuring principle cannot be applied in a low-voltage power switch, because no usable measured signal can be obtained here with a capacitive divider.

It is the object of the invention to provide a voltage transformer that has an increased dielectric strength, is small in size and can be produced economically.

In accordance with the invention, this objective is accomplished in that an operational amplifier is disposed downstream of a resistance divider comprising ohmic resistors having the required dielectric strength, with the primary winding of an inductive transformer being connected to the output of the operational amplifier and the secondary winding of the transformer forming the undervoltage side of the voltage transformer. The advantage of this type of voltage transformer over the known inductive voltage transformers is that resistors having the required dielectric strength can be obtained at low cost. The provided inductive transformers are also inexpensive components because they are allocated to the undervoltage side of the voltage transformer and only perform the task of effecting a galvanic separation between the voltage divider and the output side.

Although a voltage transformer of the invention is suitable in principle for all forms of power supply systems, the measurement can be impeded by scattered-in interference voltages if the voltage transformer is operated in a power supply system without neutral conductors and the input circuit formed by the resistors is very highly resistive. In accordance with a further development of the invention, such interferences ("humming") can be rendered ineffective in that, to form an artificial star, the one ends of the secondary windings of the inductive transformers are directly connected to one another, and the other secondary winding ends are connected to one another in each case by way of a resistor, and that an impedance converter is switched in each case between the secondary windings and a measuring device, the artificial star point being connected as a reference potential to the measuring device.

The invention is described in detail below with the aid of the specific embodiment illustrated in the FIGURE.

An ohmic voltage divider comprising a first resistor R1 and a second resistor R2 is connected to each phase conductor of the network L1, L2 and L3. Resistors R1 can have a resistance value of 4 MΩ, for example, while resistors R2 have a resistance value of 40 kΩ. At the connecting point of resistors R1 and R2, the applied network voltage is thus divided in a ratio of 1:100. Resistors R1 possess a sufficient dielectric strength; a series connection of a plurality of resistors having a correspondingly lower resistance value can also be provided for increasing the dielectric strength. The voltages applied at the connecting points of resistors R1 and R2 are supplied in each case to an operational amplifier V1, whose output feeds the primary winding Wi of an inductive transformer T. The connection points K1, K2, K3 and K4 form the voltage transformer output. A measuring device ME is provided with corresponding contacts for connection to connection points K1, K2, K3 and K4.

Measurement can be impeded by scattered-in interfering voltages if the voltage transformer is operated in a network without neutral conductors and the input circuit formed by the resistors is very highly resistive. In accordance with a further development of the invention, such interferences ("humming") can be rendered ineffective in that, to form an artificial star point, the one ends of secondary windings W2 of inductive transformers T1 are directly connected to one another, and the other ends of secondary windings W2 are connected to one another in each case by way of a resistor R3, and an operational amplifier V2 operating as an impedance converter is switched in each case between secondary windings W2 and a measuring device. The measuring device ME obtains a reference potential through a connection to the artificial star point of resistors R3.

An assembly comprising resistors R3 and operational amplifiers V2 can be configured as an additional device to be inserted as needed between connection points K1, K2, K3 and K4 and measuring device ME. This is illustrated in the FIGURE as a dot-dash outline of the aforementioned components.

Only a small amount of auxiliary power is required for operating the described voltage transformer. In a low-voltage power switch, as a rule this power is available particularly for operating the electronic overcurrent trip. A supply circuit VS, shown in the lower portion of the FIGURE, which, starting from a connection point A, has an oscillator OS and transistors V3, V4 and V5, as well as a transformer T2, can be used for the adaptation to the described voltage transformer. Diodes V6 and V7 and capacitors C1 and C2 rectify the AC current at the output of transformer T2 and smooth the ripple.

In the illustrated circuit diagram, only the lower operational amplifier V1 is shown as being connected to supply circuit VS. The other operational amplifiers V1, and operational amplifiers V2, can be operated in the same manner from supply circuit VS.

What is claimed is:
1. A voltage transformer having an increased dielectric strength and adapted to be used in a multi-pole low-voltage power switch, comprising:
   a plurality of resistance dividers each including a plurality of ohmic resistors, the ohmic resistors having a predetermined dielectric strength;
   a plurality of operational amplifiers corresponding to the plurality of resistance dividers, each of the plurality of the operational amplifiers situated in a single pole of the multi-pole low-voltage power switch and positioned downstream from a respective one of the plurality of resistance dividers;

a plurality of inductive voltage transformers corresponding to the plurality of resistance dividers and each including a primary winding and secondary winding, the primary winding coupling to an output of a respective one of the plurality of operational amplifiers, the secondary winding forming an undervoltage side of the transformer; and a plurality of impedance converters each coupled between the secondary winding of a respective one of the plurality of transformers and a measuring device, wherein, to form a star point component, a first end of the secondary winding of each of the plurality of transformers is directly coupled to a first end of the secondary winding of another one of the plurality of the transformers, and a second end of the secondary winding of each of the plurality of transformers is coupled to a second end of the secondary winding of another one of the plurality of the transformers via a respective third resistor, and wherein the star point component is coupled to the measuring device as a reference potential.

* * * * *